United States Patent [19]
Lasto et al.

[11] Patent Number: 5,785,237
[45] Date of Patent: Jul. 28, 1998

[54] DIFFERENTIAL MULTI-FLOW CONTROL NOZZLES, APPARATUS AND PROCESS

[75] Inventors: Clifford S. Lasto, Woodbridge; Jeffrey S. Duhaime, Bethany; Brian P. Czaplicki, Oxford; David J. Guzowski, Orange, all of Conn.

[73] Assignee: Air-Vac Engineering Company, Inc., Seymour, Conn.

[21] Appl. No.: 708,040

[22] Filed: Aug. 30, 1996

[51] Int. Cl.$^6$ .................... B23K 1/012; B23K 1/018
[52] U.S. Cl. .................... 228/180.22; 228/3.2; 228/19; 228/264
[58] Field of Search ............... 228/180.22, 49.5, 228/19, 6.2, 191, 264

[56] References Cited

U.S. PATENT DOCUMENTS

| | | | |
|---|---|---|---|
| 5,207,372 | 5/1993 | Funari et al. | 228/180.22 |
| 5,419,481 | 5/1995 | Lasto et al. | 228/6.2 |
| 5,560,531 | 10/1996 | Ruszowski | 228/19 |

FOREIGN PATENT DOCUMENTS

| | | | |
|---|---|---|---|
| 63-318133 | 12/1988 | Japan | 228/264 |

*Primary Examiner*—Patrick Ryan
*Assistant Examiner*—Jeffrey T. Knapp
*Attorney, Agent, or Firm*—Perman & Green, LLP

[57] ABSTRACT

Process, apparatus and nozzle device are available for controlling the soldering/and or desoldering of a land grid array (LGA) component and corresponding circuit grid present in the surface of a printed circuit board (PCB). The nozzle device comprises a vacuum cup for supporting the LGA parallel to the PCB, with the LGA and the circuit grids in contact or slightly spaced, a device for directing a continuous flow of an inert hot gas, such as nitrogen, from a gas source against the upper surface of a dielectric body of a component to conduct heat therethrough to melt an underlying LGA, vents for venting the major volume of the hot gas, adjacent the upper surface of the body of the component, and one or more vertical passages for directing a minor volume of the total gas flow from the upper surface of the component around the edges, under and horizontally through the array into a discharge chamber, and out a gas outlet. A thermocouple preferably is located at the gas outlet for sensing the temperature of the minor volume of the hot outlet gas and regulating the process, thereby avoiding exposing the melted array to the possibly disruptive force of the total hot gas flow.

14 Claims, 2 Drawing Sheets

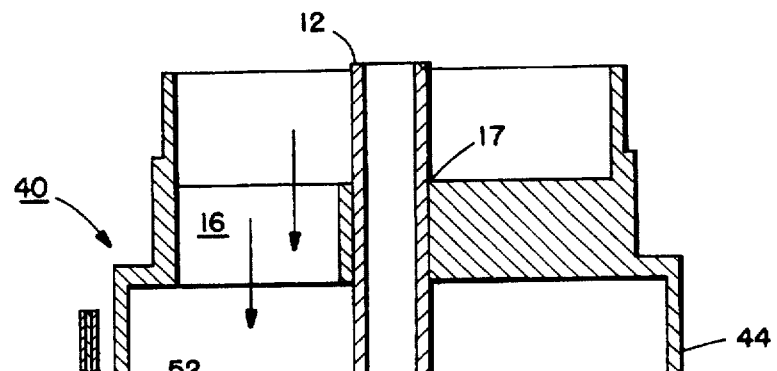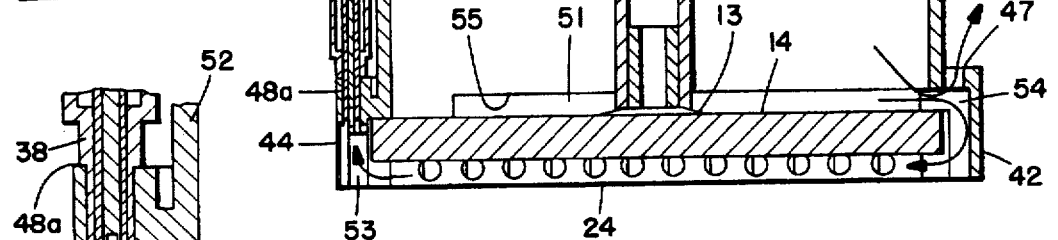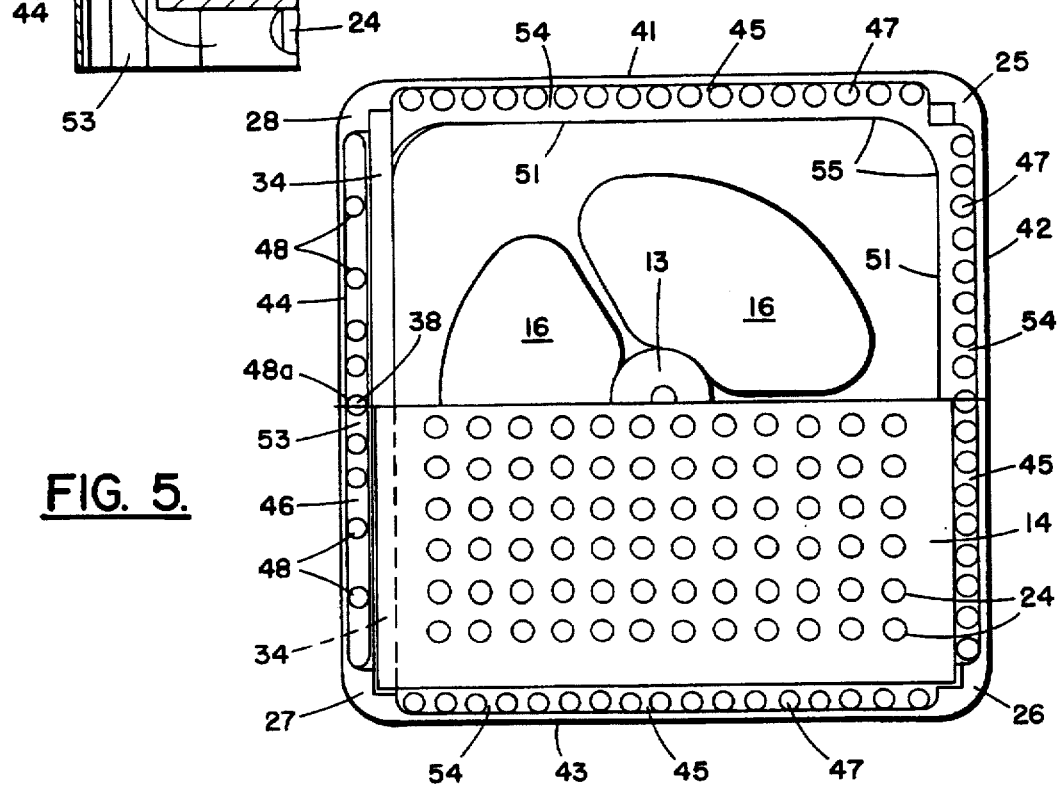

5,785,237

DIFFERENTIAL MULTI-FLOW CONTROL NOZZLES, APPARATUS AND PROCESS

BACKGROUND OF THE INVENTION

1. Field of the Invention

The present invention relates to an improved process and apparatus, including improved gas nozzle devices, for sensing and regulating the soldering and desoldering of electrical circuit components to a printed circuit board. More specifically, the present invention relates to improvements or modifications in gas nozzle devices used for the attachment or detachment of electrical circuit components having a land grid array of solder connections to a companion array of circuit connections printed onto the surface of the printed circuit board.

2. State of the Art

A variety of soldering/desoldering machines are known for the attachment and detachment of electrical circuit components from areas of crowded printed circuit boards, adjacent to other closely-spaced soldered components which are not to be disturbed. Reference is made to commonly-assigned U.S. Pat. No. 5,419,481 for its disclosure of a peripheral under-flow system and apparatus, including vacuum gas nozzles for holding an electrical component relative to a PCB surface and for directing hot gas through peripheral slots in the nozzle downwardly and under the dielectric body of a face-down or land grid array (LGA) component, including ball grid array (BGA) components, solder grid array (SGA) components, and column grid array (CGA) components. Such components comprise a grid array of spaced solder connections on the undersurface of a dielectric or ceramic body, for electrical connection to a companion array of spaced circuit connections exposed at the upper surface of the printed circuit board.

The system and apparatus of U.S. Pat. No. 5,419,481 represent an important advance over conventional soldering/desoldering machines and conventional vacuum/gas nozzles of the heat-conduction or flow-through type which apply heated gas at a predetermined fixed temperature and flow rate through a nozzle device, and against the upper surface of a component enclosed thereby, to heat the component body and melt the solder grid array therebeneath. Such known systems have important disadvantages. For example, the applied hot gas does not have a controlled flow path and therefore it can flow from the nozzle against adjacent components on a PCB, causing melting and shorting thereof, unless deflector shields are placed at the gas outlets to deflect the hot gas away from the adjacent components. Also, since the flow path of the hot gas, is not directed under the component to the area of the solder grid array, the array is melted only by indirect heating through the component body in the presence of ambient air and oxygen, whereas solder joints formed where an inert atmosphere, such as nitrogen, displaces the ambient air are recognized to be superior. Also, the temperature of the gas at the upper surface of the component body is not representative of the gas temperature in the area of the solder array.

The most important disadvantage of such heat-through systems is that they are regulated to operate at predetermined fixed temperatures and flow rates, and do not incorporate any means for the automatic adjustment of gas flow rate and/or temperature when the temperature in the area of the solder array reaches a predetermined value. For example, at initial start-up the printed circuit board is relatively cold and higher flow rates and/or gas temperatures are required for the soldering operation. However if a plurality of adjacent components are being soldered/desoldered, the successive operations require less heating and may be ineffective unless the apparatus is automatically controlled to regulate the flow rate and/or temperature for the changing conditions of use. Even if this is done, the adjustments must be on the basis of trial by error.

It is a critical feature of the process and apparatus of U.S. Pat. No. 5,419,481 that the solder-melting hot gas is supplied to the underside or multi-contact side of the LGA component from one or more directions, and is withdrawn or permitted to exhaust from one or more opposed directions, whereby a continuous hot gas flow is maintained through all of the spaced solder land islands of the land grid array for a sufficient period of time to produce melting thereof. The flow rate of the hot gas through the spaced solder islands, and the dwell time of the hot gas beneath the LGA component, are controlled by flow meters and length of process time which depends on the type of the device and the printed circuit board characteristics and the temperature of the gas, and /or by controlling the rate of withdrawal of the hot gas through the gas outlet orifices, in order to produce the necessary melting of all of the spaced solder islands while minimizing dwell time, overheating and disruptive turbulence of the gas flow through the solder array.

Among the problems encountered in attempting to minimize dwell time of the component within the nozzle, during the soldering/desoldering operation, are the sizes of the different nozzles and of the components being attached thereby, the number and size or volume of the spaced solder islands and their composition and melting point, the temperature of the apparatus and/or of the nozzle and/or the PCB, i.e., whether the operation is an initial start-up or a sequential cycle, and other variables which affect the temperature, flow rate and dwell time necessary to optimize the soldering/desoldering operation, while minimizing the impact on surrounding components or assemblies.

An improved process and apparatus is disclosed in commonly-owned U.S. Pat. No. 5,553,768 issued Sept. 10, 1996, comprising controlling the temperature and/or flow rate of a hot gas supply, directing the total volume of said gas at a flow rate peripherally through a component nozzle, under a component supported therein, through the solder array and out one or more opposed hot gas outlets, sensing the temperature of the gas at at least one said outlet, which is representative of the gas temperature in the area of the solder array under said component, and automatically regulating the temperature and/or flow rate of the hot gas before and/or as the solder melts in order to control the melt conditions and dwell time, to optimize the soldering/desoldering operation.

While the copending application discloses a process and apparatus representing an important advancement in the art over prior-known peripheral under-flow systems, there is room for further improvement with respect to the uniformity of heating of the solder ball array and reducing the reflow cycle time while minimizing exposure of the heated solder ball array to hot gas flow turbulence.

SUMMARY OF THE INVENTION

The present invention relates to an improved differential multi-flow control nozzle, apparatus and process for increasing the uniformity of heating and the rate of heating of the solder lead array on the underside of a dielectric or ceramic body of an electrical component on a printed circuit board, while minimizing exposure to large volume gas flow turbulence and avoiding the heating of adjacent components. This is accomplished by passing the hot gas flow through a hybrid nozzle which directs the entire gas flow against the upper surface of the component, to conduct heat through the component to the underlying solder ball array, vents the major volume of said gas flow out of the nozzle and away from the component and channels a minor portion of the total gas flow to flow under the component, through the solder lead array and out through one or more opposed exhaust outlets, preferably associated with a temperature-sensing means or thermocouple to sense the temperature of the gas exiting the solder lead array.

THE DRAWINGS

FIG. 4 is a cross-sectional side view of a vacuum/gas nozzle device according to another embodiment of the present invention;

FIG. 5 is a bottom view of the nozzle device of FIG. 4, and

FIG. 6 is an enlarged view of a section of the nozzle device of FIG. 4.

DETAILED DESCRIPTION

The novel gas nozzle devices of the present invention, as illustrated by the drawings, are differential multi-flow nozzles which direct the total hot gas flow against and over the upper surface of the component held within the nozzle, cause the major volume of said gas to directly exit the nozzle through upper vent holes in side walls of the nozzle component recess, and cause a minor volume of said gas to be directed beneath the component body, through the solder array, to a discharge chamber from which it is exhausted through one or more vents in the fourth wall of the nozzle component housing. According to a preferred embodiment, the temperature of the gas is sensed in the discharge chamber or at the discharge vents as an indication of the progress of the soldering or desoldering operation.

A critical advantage of the design of the present nozzles, in addition to the improved heating of the solder array by passing a minor portion of the hot gas directly through the solder array, is that they permit the use of an inert hot gas such as nitrogen whereby the melting of the solder in an inert nitrogen atmosphere produces superior solder connections, free of oxide contamination. This is not possible unless the hot inert gas is caused to flow through the solder array and to displace ambient air.

Figure 1:
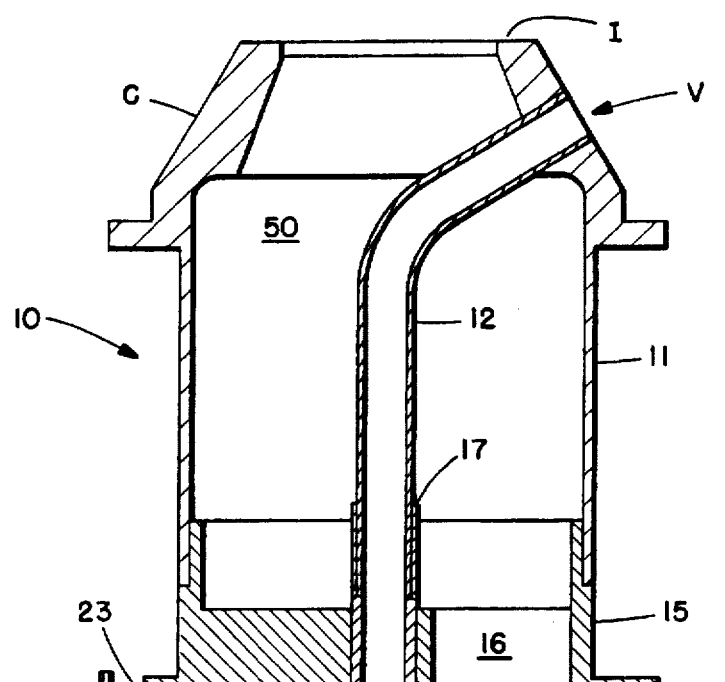
FIG. 1 is a cross-sectional side view of a vacuum/gas nozzle device according to an embodiment of the present invention.

Referring to the drawings, FIG. 1 illustrates a preferred vacuum/gas nozzle device 10 comprising a hollow housing 11 having a rectangular lower wall portion and a cylindrical upper wall portion, enclosing a hot gas chamber 50, to which is attached a top cone section C which is mountable within the adjustable vacuum/heater head assembly of a surface mount soldering/desoldering apparatus such as disclosed in U.S. Pat. No. 5,044,072. The cone section comprises a hot gas cone inlet I for receiving temperature-controlled forced hot gas within the hollow housing 11 and a vacuum inlet V to the vacuum suction cup 13 to retain and support the BGA component 14 comprising a dielectric body having a solder lead array 24 at the undersurface thereof. The nozzle device 10 further comprises a lower block section 15 which seals the lower end of the hollow housing 11 except for a plurality of vertical gas inlet passages 16 and a central vacuum bore 17.

The nozzle device 10 is provided with a rigid vacuum tube connection 12 between a passage through the cone section and the bore 17 in the block 15, to permit a vacuum to be drawn through the nozzle device 10 to a component-engaging vacuum suction cup 13 mounted within a lower restricted outlet of the bore 17, at the central ceiling area of the component-receiving or nesting area 18 within the underside of the block 15. Area 18 is rectangular or substantially square, as illustrated, and is custom-dimensioned to receive and accommodate the dielectric or ceramic body of a LGA component 14 of predetermined known dimensions so that the sides of the body of the component 14 are closely-spaced from the block walls 20, 21, 22 and 23. The depth of the nesting area 18 from the undersurface of the suction cup 13 to the base of the outer housing walls is substantially the same as, or preferably is up to about 0.03" greater than, the thickness of the LGA component 14 from the upper surface thereof, vacuum-engaged by the suction cup 13, and the undersurfaces of the solder balls 24 of the array. It is preferred to provide the slight spacing of up to about 0.03" to prevent crushing the solder balls and to allow to settle down onto the solder board connections when the s older joints become molten.

The component 14 is positioned within the area 18 by means of corner pilots 25, 26, 27 and 28 which have seat areas which engage the corners of the component 14 at the upper surface thereof. Pilots 25 and 26 are spaced from each other and from pilots 27 and 28 to permit the free passage of the hot gas, such as nitrogen down into the spaces 29, 30 and 31 between the block walls 20, 21 and 22 and the adjacent edges of the component 14, where the major volume of the hot gas is free to escape from the housing through vents 32 and against deflectors 33 which direct the escaping hot gas upwardly to protect any adjacent components.

The other pair of centering pilots 27, 28 are connected to each other by means of continuous recessed seat or shelf 34, along the fourth block wall 23, which provides continuous engagement with the upper surface of the component 14 along the entire edge of the component which is spaced from the fourth block wall 23.

Figure 3:
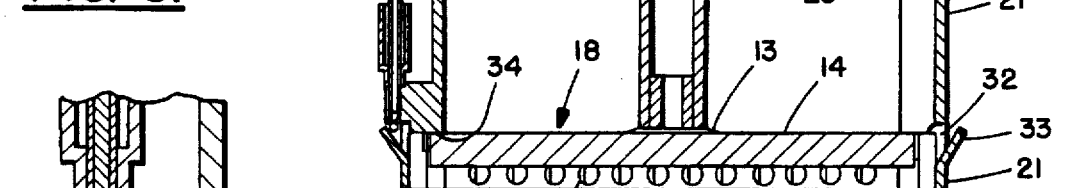
FIG. 3 is an enlarged sectional view of an area of the nozzle of FIG. 1.
Figure 2:
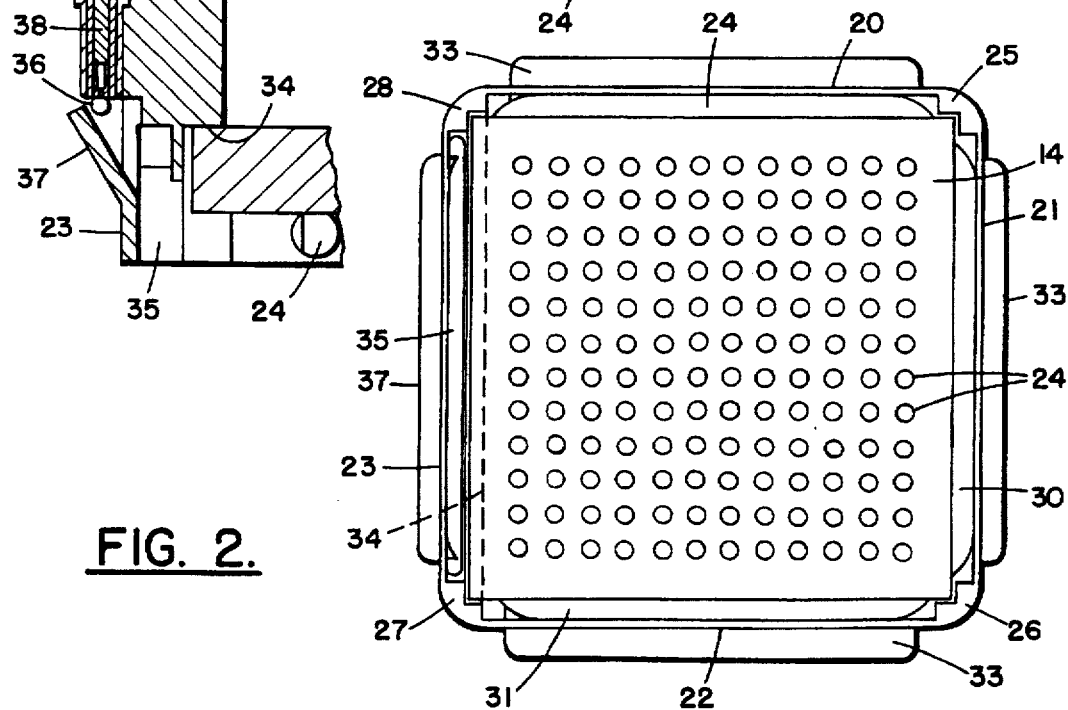
FIG. 2 is a bottom view of the nozzle device of FIG. 1.

As illustrated by FIGS. 1 to 3, the seating engagement of the edge of the component 14 with the shelf 34 prevents the passage of hot air around the upper edge of the component down directly from the nozzle housing chamber 50 into the solder array vent passage 35 and out the vent 36 against deflector 37. In order for the hot gas to take this flow path it must flow down around the spaced edges of the component 14, through spaces 29, 30 and/or 31, past the vents 32 in block walls 20, 21 and 22, through the solder array 24 and into the solder array vent passage 35. Since the hot gas takes the path of least resistance, the major volume of the total hot gas volume exits the vents 32 while only a minor volume bypasses the vents 32, flows under the component 14 and through the solder array 24 to the vent passage 35 and out the vent 36.

In the embodiment of FIGS. 1 to 3, the temperature of the hot gas exiting from the solder array is sensed by a thermocouple 38 positioned at the outlet of the vent 36 as an accurate measurement of the gas temperature attained in the environment of the solder array 24.

The gas inlet passages 16 open against the top surface of the dielectric body of the component 14, centered within the nesting area 18 to heat the component body and conduct heat therethrough to melt the solderballs 24 while the major volume of the gas flow is discharged through passages 29, 30 and 31 and through vents 32 in the three adjacent side walls 20, 21 and 22 of the nozzle. The hot gas is prevented or blocked from flowing from the passages 16 to the underside of the component 14 except through wall passages 29, 30 and 31. While most of the hot gas flow through wall passages 29, 30 and 31 exits through the vents 32, a minor portion of the hot gas flow passes down through the passages 29, 30 and 31 and through the array of solder balls 24, and into vent passage 35 at the base of the fourth wall 23 of the nozzle element, which is the wall opposite wall 21.

As illustrated by FIG. 1, the gas outlet port 36 in housing wall 23 is spaced upwardly, away from the base thereof, to cause the minor volume of hot outlet gas from the array 24 to flow upwardly against or over deflector 37 and away from the surface of the PCB, to preclude the possible melting or damaging of adjacent components and/or solder connections thereon. Furthermore, the sensor of the thermocouple 38 is associated with the outlet 36 and the deflector 37, mounted on the outer surface of wall 23, whereby the temperature of the hot gas flow from beneath the component 14 is sensed and used to regulate the process parameters including gas flow rate, gas temperature and cycle time and provide real-time process control feedback without exposing the melted solder array to the possibly disruptive effects of major volume of the hot gas flow. A vacuum outlet-assist means may be particularly useful in cases where the solder ball array comprises a dense array of small-diameter balls 24 through which it may be difficult for the hot gas to be forced without vacuum-assisted withdrawal.

While the design of FIGS. 1 to 3 incorporates passages 29 and 31 and vents 32 which extend along substantially the entire width of the opposed side edges of the component 14, it will be apparent to those skilled in the art that portions of the passages 29 and 31 and/or of the vents 32 may be blocked or omitted in the areas closest to the seat or shelf 34, in order to increase the size of the minor volume of the hot gas which is forced to flow under the component 14 and through the solder array 24.

The present thermocouple means 38, comprises a conventional heat-sensitive element such as a thermocouple wire which operates on the principle of increased voltage with increasing temperature whereby the voltage is correlated to the temperature thereof. The temperature of the hot gas exiting the outlet 36 is indicative of the temperature of the hot gas flowing through the solder ball array 24 at the undersurface of the component 14, which is more indicative of the temperature of the solder array than the temperature of the gas exiting the other vents 32. As the sensed temperature at outlet 36 approaches a predetermined actuation temperature, below the melting temperature of the solder balls 24, the flow rate of the total hot gas flow can be reduced and the temperature thereof can be increased. The cycle can be discontinued when the sensed temperature reaches a predetermined final temperature. This, coupled with the fact that the major volume of the hot gases does not flow through the solder array 24, avoids the application of the excessive force of the total gas flow to the array during a soldering or desoldering operation, while assuring that adequate heat continues to be applied to melt all of the solder balls. Generally, the thermocouple 38, which comprises a junction of two different wires which accomplish a net conversion of thermal energy into electrical energy with the appearance of corresponding current flow, is integrated with a computer associated with an adjustable flow meter and gas heater to automatically decrease the flow rate and raise the temperature when the predetermined exit temperature is sensed, as more fully disclosed in aforementioned copending U.S. Pat. No. 5,553,768.

The differential multi-flow control nozzle block 40 according to the embodiment of FIGS. 4 to 6 is similar in function but somewhat different in design from the block 15 of FIGS. 1 to 3, and similar elements are numbered as in FIGS. 1 to 3.

The block 40 has a lower skirt extension forming outer housing walls 41, 42, 43 and 44 and upper vent walls 45 and 46 containing vent holes 47 and 48, respectively. As illustrated by FIG. 4, the outer wall 49 of the block 40 has a lower termination 55 which extends just below the upper vent walls 41, 42 and 43 along three sides of the skirt extension but above the level of the vacuum suction cup 13 which is the level of the upper sur face of a component 14 nested within the nozzle. This provides a peripheral slot 51 which is open to the skirt extension walls 41, 42 and 43 and their vent holes 47 but is not open to the fourth skirt wall 44 or to the vent holes 48 therein. Since the outer wall 52 of the block 40, along the side having the continuous recessed ledge or shelf 34, extends down to form said shelf 34 it engages an edge of the component 14 nested within the nozzle to block the passage of hot gas from the nozzle compartment directly into the solder array event passage 53.

Thus, as with the nozzle device of FIGS. 1 to 4, all of the hot gas, such as nitrogen, is directed downwardly through the passages 16 against the top surface of the component 14 engaged against the seats of the pilots 25, 26, 27 and 28 and against the continuous shelf 34, to conduct heat through the component to the underlying solder array 24. The hot gas then flows through the peripheral wall slot 51 and into the skirt extension compartment 54 from which the major volume thereof escapes through the plurality of vent holes 47. A minor volume of the hot gas is forced to flow beneath the component 14, through the solder array 24, and into the solder array vent passage 53 from which it escapes through vent holes 48.

Preferably a thermocouple sensor 38 is extended through a central vent hole 48a into the passage 53 to sense the temperature of the hot gas exiting the solder array 24 as a precise indication of the temperature of the solder balls.

The nozzle device of FIGS. 4 to 6 has the added advantage that the hot gas is discharged in an upward direction from the skirt extension, through the vent holes 47 and 48, away from the printed circuit board and away from adjacent components on the board.

As disclosed in copending U.S. Pat. No. 5,553,768, in a typical example, the system may be pre-set or programmed for start-up conditions for heater and flow regulator to produce an initial supply of nitrogen gas to nozzle compartment 50 at a predetermined temperature and flow rate, while the thermocouple sensor 38a is sensing a temperature at gas outlet 36 or in compartment 53. As the gas outlet temperature increases and reaches the predetermined actuation temperature, e.g. 170° C., the thermocouple 38 signals the programmed computer to adjust the gas flow rate at the flow regulator, as well as the gas temperature at the heater between a gas source and an inlet to the nozzle compartment 50 during the melting phase. Finally, as soon as the final temperature, e.g., about 205° C., is sensed by thermocouple sensor 38 the programmed computer is signalled to discontinue gas flow from the supply until the next soldering/desoldering cycle.

It will be apparent to those skilled in the art that the present temperature-sensing apparatus preferably is computer program-controlled and automatically-adjustable to provide maximum flexibility required to handle a wide range of LGA-type packages and assemblies and/or to provide variable flow rates and dwell times. In most instances it is desirable to use hot inert gas and a high initial flow rate to minimize the dwell time of the component 14 within the nozzle device 10 and minimize the cycle time or period of time that the component is exposed to the high heat and/or to minimize the duration of heating of adjacent components on the PCB. These variables can be programmed into the computer means to enable automatic selection of the desired condition of operation to produce the desired results in cooperation with the thermocouple 38.

The essential novelty of the present nozzles and their use, over the nozzles and process of the copending U.S. Pat. No. 5,553,768 resides in directing the entire gas flow against the upper or top surface of the component 14 within the nesting area 18 in the underside of the nozzle block 15, to heat melt the solder array quickly by means of heat conducted through the dielectric body of the component, venting the major volume of the gas flow from the nozzle through vent openings 32 or 47 in one or more of the three adjacent walls 20, 21 and 22, or walls 45 of the nozzle housing adjacent the upper surface of the component, to avoid exposing the melted solder joints to a high volume disruptive gas flow which can displace or deform the closely-spaced balls of the molten solder array. However, in order to sense the temperature of the gas in the area of the solder array, which is the most critical area, the present nozzles are provided with a vertical hot gas flow spaces 29, 30 and 31, and 54, around three edges of the component 14. This causes a minor volume of the total gas flow, which does not escape through the vents 32 in walls 20, 21 and 22 of FIG. 1 or through vent holes 47 in walls 45 of FIG. 4, to flow to the underside of the component 14, horizontally through the solder ball array 24 and out through the gas outlet 36 of FIG. 1 or into the vent passage 53 of FIG. 4 for sensing by the thermocouple 38. The temperature of said minor volume is most indicative of the temperature of the solder array, thereby providing such information without exposing the molten solder array to the disruptive turbulence of a large volume hot gas flow therethrough.

The present nozzles are precision dimensioned to support an LGA component in alignment over the surface of a PCB so that the undersurfaces of the solder balls 24 lightly engage or, more preferably, are slightly spaced above the contact areas of the PCB by a distance less than about 0.03". This prevents crushing and spreading of the solder balls during the melting step. With the present nozzles of the housing walls 20, 21, 22 and 23 of FIG. 1, and walls 41, 42, 43 and 44 of FIG. 4, form a skirt the base of which engages the surface of the PCB so that the component 14 is automatically supported in the desired position provided that the depth of the nesting area 18 is properly machined, i.e., the depth of the seats in the pilots 25 and 26 and of the ledge 34 of FIGS. 2 and 5, so that the distance between the undersurface of the vacuum cup 13 and the surface of the PCB corresponds to, or preferably is slightly greater than, the thickness of the component 14 from the upper surface of the dielectric body thereof to the undersurfaces of the solder balls 24. Components 14 of different dimensions require customized nozzles having corresponding dimensions.

In certain soldering/desoldering machines, such as that of U.S. Pat. No. 5,044,072, the vertical positioning means may be calibrated so that the proper stop positions for nozzles of different dimensions may be predetermined and recorded.

It will be apparent to those skilled in the art that a number of different operational parameters of the present nozzle devices can be varied in relative relationship to each other in order to vary the results produced. Thus, the relative total area of gas vents 32 and gas-outlet 36 of FIG. 1, and vent holes 47 and 48 of FIG. 4 are important and can be varied, relative to each other, to provide nozzle devices having different flow patterns through the solder ball array. The vents 32 and holes 47 may be present on only wall 21 or 42 or on said walls and on portions of the adjacent walls 20 and 22 of FIG. 1 or 41 and 43 of FIG. 4.

The vacuum retention of the LGA components 14 within the nesting area 18 of the present nozzle devices, parallel to the PCB, supports the solder array 24 in surface contact with, or preferably slightly above, the mating circuit array on the PCB, and the suction cup 13 permits some flexible movement of the component 14 if solder coplanarity is not perfect. Also the vacuum retention of the component prevents any tilting or sagging of the component when melting of the solder array occurs.

Each of the present unitary nozzle devices is precision manufactured to accommodate LGA components of a specific size or type. Thus the dimensions of the component-receiving nesting area 18 are such as to retain the LGA component centered therein, providing clearance above the dielectric body of the component, outwardly from the suction cup for the introduction and horizontal flow of the hot gas, and below the array to prevent the undersurface of the solder ball array of a retained component from crushing and spreading of the solder balls 24 against the PCB surface when melting occurs.

The use of the present nozzle devices in association with a hot gas soldering/desoldering apparatus of the type disclosed in U.S. Pat. No. 5,044,072 reduces any risk of misalignment of the LGA/component relative to the circuit array of the PCB, alleviates process problems and simplifies operation procedures for the soldering and/or desoldering of land grid array components including solder bump array components, micro ball grid arrays, ball grid array components, column grid array components and other components having partially or completely hidden solder connections such as flip chip carriers, both ceramic and plastic. Such soldering/desoldering apparatus comprises a releasable clamping means for receiving and engaging the top cone section C of each nozzle device within the adjustable vacuum/hot gas heater head assembly, for supplying vacuum through the vacuum inlet V of the nozzle device to retain the component, and for supplying hot gas through the cone inlet I of the aligned nozzle device at the desired temperatures and flow rates, in response to signals from the thermocouple to the programmed computer, during the soldering or desoldering cycles of operation.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. Process for controlling the uniform, substantially-simultaneous melting of the leads of a solder lead array present at the undersurface of an electrical component comprising a dielectric body while said array is in contact with or spaced slightly above, or is bonded to a corresponding circuit array present on the surface of a printed circuit board, comprising supporting said component within a nozzle housing, parallel to the printed circuit board surface, with said solder lead array and said circuit array aligned in contact or slightly spaced, introducing a continuous flow of hot gas from a gas source through said nozzle housing and against the upper surface of said dielectric body to heat said body and said solder lead array, exhausting the major volume of said hot gas flow from said component through said nozzle housing; channelling a minor volume of said hot gas flow around one or more edges of the component downwardly to the undersurface of said dielectric body and horizontally through said lead array into a discharge chamber, and exhausting said minor volume of hot gas from said discharge chamber through at least one hot gas outlet to produce the desired uniform and simultaneous melting of said solder lead array and permit bonding to or separation from the circuit array on said printed circuit board while avoiding the exposure of the melted solder lead array to the flow of the major volume of the hot gas.

2. Process according to claim 1 which comprises sensing the hot gas temperature at the hot gas outlet by means of a thermocouple electrically-connected to a control means, to automatically adjust the temperature and/or flow rate of the total hot gas flow in response to a predetermined temperature of the minor volume of the gas flow sensed at the hot gas outlet.

3. Process according to claim 1 which comprises supporting said electrical component by means of vacuum within a nozzle housing having peripheral walls, and venting the major volume of the hot gas flow through one or more openings in said walls.

4. Process according to claim 1 which comprises locating each said hot gas vent and outlet upwardly away from the surface of the printed circuit board to direct the hot outlet gas away from adjacent electrical components present on the printed circuit board.

5. Process according to claim 4 which comprises locating an upwardly inclined deflector wall at the exit of each said hot gas vent and outlet to deflect the path of the hot gas from said outlet upwardly, away from the surface of the printed circuit board.

6. A unitary vacuum/hot gas nozzle device for supporting an electrical component comprising a dielectric body having a meltable solder lead array at the undersurface thereof, in contact with or closely-spaced above a corresponding circuit array present on the surface of a printed circuit board, and for directing a continuous flow of hot gas from a gas source at a predetermined temperature and flow rate against the upper surface of said dielectric body to heat said body and melt said solder lead array while causing a minor volume of said gas flow to circulate through said solder lead array, said nozzle device comprising a housing having an upper wall section enclosing an internal hot gas chamber and a lower wall section enclosing a block member having a component nesting area comprising spaced component-supporting members in the undersurface thereof, vacuum conduit means, through said housing and block member, to retain a said component within said component-supporting members, inlet means for receiving hot gas into said hot gas chamber, means for channeling the hot gas from said chamber to said component nesting area and against the upper surface of a component retained within said component-supporting members, vent means for exhausting the major volume of said hot gas flow from said component-supporting recess, through said nozzle housing; passage means for channeling a minor volume of said hot gas flow around one or more edges of a said retained component downwardly to the undersurface of said dielectric body and horizontally through the meltable solder lead array to a discharge chamber at said undersurface while the component is retained by said vacuum means within said component-supporting members, and at least one hot gas outlet from said discharge chamber at the undersurface of said component for venting the minor volume hot gas flow which has passed through said solder lead array, to produce uniform and gradual melting of the solder lead array, thereby avoiding the exposure of the melted solder lead array to the flow of the major volume of hot gas admitted to the nozzle.

7. A nozzle device according to claim 6 in which said vacuum conduit means terminates in a vacuum suction cup within said component nesting area, for vacuum-engagement with the upper surface of a retained component.

8. A nozzle device according to claim 6 in which the lower wall section of the housing is of sufficient length to contact the upper surface of a printed circuit board, and the depth of the component nesting area is predetermined for each supported component so that the undersurface of the solder array thereof is slightly spaced above the surface of the corresponding circuit array on the printed circuit board when said lower wall is in contact with the surface of the printed circuit board.

9. A nozzle device according to claim 6 in which each said hot gas outlet comprises an opening in the lower wall section of the housing, spaced upwardly, away from the base of said wall section, for venting the hot gas upwardly away from the surface of a printed circuit board.

10. A nozzle device according to claim 6 in which said component nesting area is rectangular in horizontal cross-section and said spaced component-supporting members comprise two spaced pilot members containing recesses adapted to receive and retain adjacent corners of a component, and an opposed shelf member adapted to receive and engage the edge of the component lying between the other two corners of the component.

11. A nozzle device according to claim 6 in which the engagement of a said component within said component-engaging members leaves space between up to three edges of the component and the inner walls of the housing, forming the said passage means for the minor volume of hot gas, and sealing engagement between the fourth edge of the component and an inner wall of the housing whereby any hot gas exiting the housing through the hot gas outlet in the fourth wall is forced under the component as said minor volume hot gas flow.

12. A nozzle device according to claim 6 further comprising a temperature-sensing means mounted on the lower wall section of the housing for sensing the temperature of the hot gas in or exiting the discharge chamber.

13. A nozzle device according to claim 12 in which the temperature sensing means comprises a thermocouple electrically-connected with a computer means with which is connected means for controlling the temperature and the flow rate of the hot gas from the gas source, through the nozzle device in response to a predetermined discharge gas temperature of the minor volume sensed by the thermocouple.

14. A nozzle device according to claim 13 in which the lower wall section of the housing , adjacent the hot gas vent means and outlet, comprises means for directing the path of hot gas existing the gas outlet vertically, away from the printed circuit board.

* * * * *